(12) United States Patent
Dorsch et al.

(10) Patent No.: US 11,894,662 B2
(45) Date of Patent: Feb. 6, 2024

(54) DEVICE FOR DISCHARGING OVER VOLTAGES AND ITS USE

(71) Applicant: TDK Electronics AG, Munich (DE)

(72) Inventors: Eduard Dorsch, Dallgow (DE); Frank Werner, Berlin (DE)

(73) Assignee: TDK Electronics AG, Munich (DE)

( * ) Notice: Subject to any disclaimer, the term of this patent is extended or adjusted under 35 U.S.C. 154(b) by 100 days.

(21) Appl. No.: 17/635,886

(22) PCT Filed: Nov. 11, 2020

(86) PCT No.: PCT/EP2020/081730
§ 371 (c)(1),
(2) Date: Feb. 16, 2022

(87) PCT Pub. No.: WO2021/115709
PCT Pub. Date: Jun. 17, 2021

(65) Prior Publication Data
US 2022/0302681 A1      Sep. 22, 2022

(30) Foreign Application Priority Data

Dec. 13, 2019 (DE) .......................... 102019134337.2

(51) Int. Cl.
*H01T 4/16* (2006.01)
*G01R 19/165* (2006.01)
*H02H 3/32* (2006.01)

(52) U.S. Cl.
CPC ............. *H01T 4/16* (2013.01); *G01R 19/165* (2013.01); *H02H 3/325* (2013.01)

(58) Field of Classification Search
CPC .... H01T 4/00; H01T 4/16; H01T 4/20; H01T 15/00; H02H 3/26; H02H 3/32;
(Continued)

(56) References Cited

U.S. PATENT DOCUMENTS 3,848,156 A    11/1974  Tolstov et al.
8,080,927 B2   12/2011  Boy et al.
(Continued)

FOREIGN PATENT DOCUMENTS

CN    101252279 A    8/2008
CN    102104249 A    6/2011
(Continued)

OTHER PUBLICATIONS

Dehn SE, "Product Data Sheet: DEHNshield ZP," DSH ZP B TNC 255 (900 395), Sep. 2019, 2 pages.
(Continued)

*Primary Examiner* — Long Nguyen
(74) *Attorney, Agent, or Firm* — Slater Matsil, LLP

(57) ABSTRACT

In an embodiment a device includes a first arrester unit with at least one first gas-filled surge arrester and a second arrester unit with at least one second gas-filled surge arrester, wherein the first and second arrester units are connected in series with one another between a first potential node and a reference potential node, wherein the first arrester unit and the second arrester unit are different from each other, wherein the first arrester unit includes a larger response voltage than the second arrester unit, and wherein the first arrester unit includes a smaller arc voltage than the second arrester unit.

14 Claims, 4 Drawing Sheets

(58) Field of Classification Search
CPC .......... H02H 3/325; H02H 9/04; H02H 9/041; H02H 9/06; G01R 19/165; G01R 19/16533

See application file for complete search history.

(56) References Cited

U.S. PATENT DOCUMENTS

| | | |
|---|---|---|
| 10,903,647 B2 | 1/2021 | Meyer et al. |
| 2008/0198527 A1 | 8/2008 | Higashi et al. |
| 2018/0198260 A1* | 7/2018 | Bobert ................ H02H 9/06 |
| 2019/0214816 A1* | 7/2019 | Dorsch ................ H02H 9/044 |

FOREIGN PATENT DOCUMENTS

| | | |
|---|---|---|
| DE | 102008029094 A1 | 1/2009 |
| DE | 102009049579 A1 | 4/2011 |
| DE | 102015114504 A1 | 3/2017 |
| DE | 102016101633 A1 | 8/2017 |
| DE | 102018118906 B3 | 10/2019 |
| WO | 2009050152 A1 | 4/2009 |
| WO | 2017129291 A1 | 8/2017 |

OTHER PUBLICATIONS

Zhongguang Hi-Tech, "ZGGFS4-275(1+1)a Modular Power Supply SPD Product Specification," 2021, 5 pages.

* cited by examiner

DEVICE FOR DISCHARGING OVER VOLTAGES AND ITS USE

This patent application is a national phase filing under section 371 of PCT/EP2020/081730, filed Nov. 11, 2020, which claims the priority of German patent application 102019134337.2, filed Dec. 13, 2019, each of which is incorporated herein by reference in its entirety.

TECHNICAL FIELD

A device for discharging overvoltages is specified. Furthermore, the use of the device in an electrical appliance or in an electrical network is specified.

BACKGROUND

In order to limit dangerous or unwanted overvoltages in electrical lines and appliances, which can be caused, for example, by lightning strikes, overvoltage protection devices in the form of surge arresters are used. These help to prevent damage to lines and appliances caused by overvoltage. For example, there are surge arresters filled with gas, so-called gas arresters, in which an overvoltage is dissipated by the automatic ignition of a gas discharge and thus by an arc discharge. After an arrester response voltage, which can also be referred to as response voltage or ignition voltage, is reached by an overvoltage applied to the arrester, for example in the form of an overvoltage pulse, an arc forms in the arrester within nanoseconds. Due to its high current-carrying capacity, the overvoltage is effectively short-circuited.

The response voltage is also referred to as the DC response voltage in the case of static or steady-state loading, for example with a voltage rise of the order of 100 V/s. In the case of dynamic loading, for example with a voltage rise in the order of 1 kV/µs, the response voltage is also referred to as the impulse response voltage. The DC response voltage and the protection level, i.e. the impulse response voltage, are proportional to each other in gas arresters. If the DC response voltage can be reduced, the protection level also becomes lower. Accordingly, the DC response voltage of a multi-section arrester can also be reduced in order to lower its protection level.

A gas arrester switches to a conductive state with the generation of the arc, which can also be referred to as "arc mode". The are voltage in the gas arrester can typically range in magnitude from 10 V to 100 V, depending on the current and the type of gas arrester. When the voltage applied to the gas arrester falls below the are voltage, the arc will self-extinguish. However, if the power supply to which the gas arrester is terminated supplies a line voltage that is higher than the are voltage, a so-called follow current is generated that can maintain the arc. For example, the line voltage may be a common alternating current voltage of 255 $V_{ac}$. Only the voltage zero crossing of the AC sine wave can extinguish the follow current in the gas arrester. In the case of a mains voltage formed by a direct current voltage, it may even be the case that the are and the associated current flow will not be extinguished without further ado if the direct current voltage is higher than the are voltage. This is only the case when the voltage applied to the gas arrester falls below its arc voltage, which counteracts the direct current voltage applied. In this case, if the intensity of current following the are is a few kiloamperes, the fuse of the power supply will respond, but with usual current flow durations of a few milliseconds until the fuse responds the gas arrester may be damaged.

To increase the voltage at which the arc extinguishes in a surge protection device, for example, several gas arresters of the same type can be connected in series so that the are voltages add up. However, this also increases the response voltage required to ignite all of the gas arresters, and thus the protection level of the surge protection device, since the ignition voltage at which the gas arresters of a series connection of gas arresters ignite is proportional to the number of gas arresters.

SUMMARY OF THE INVENTION

Embodiments provide a device for discharging overvoltages. Further embodiments provide a use for the device for dissipating surges.

According to at least one embodiment, a device for discharging overvoltages, which may also be referred to hereinafter as discharge device or device for short, comprises a first arrester unit with at least one first gas-filled surge arrester and a second arrester unit with at least one second gas-filled surge arrester, which are connected in series with one another between a first potential node and a reference potential node. In the following, the gas-filled surge arresters are also referred to as surge arresters or gas arresters for short. Each of the gas arresters comprises a closed, gas-filled volume in which at least two electrodes are arranged, between which a gas discharge can take place, in particular with the formation of an arc, if a sufficiently high electrical voltage is applied.

According to a further embodiment, the device is used to discharge overvoltages in an electrical appliance or in an electrical network. The electrical network may be an AC network or a DC network. Further, the electrical appliance may be an AC appliance or a DC appliance. The features described above and in the following apply equally to the device and to the use of the device.

The reference potential node particularly preferably corresponds to a protective conductor or PE conductor or a neutral conductor or N conductor. The first potential node preferably corresponds to a phase or an L conductor. Accordingly, the first and second arrester units are preferably connected in series between an L conductor and an N conductor or between an L conductor and a PE conductor. Furthermore, it is also conceivable that the first potential node corresponds to an N conductor and the reference potential node corresponds to a PE conductor.

In particular, the first arrester unit and the second arrester unit are different from each other. Particularly preferably, this means that the first arrester unit and the second arrester unit comprise different gas-filled surge arresters. Accordingly, it is particularly preferred that the first surge arrester and the second surge arrester are different from each other. The fact that two surge arresters are different from each other may in particular mean that the surge arresters differ in at least one or more of the following characteristics: gas type, gas pressure, gas volume, electrode material, electrode geometry, electrode spacing, number of electrodes, internal ignition aid.

According to a further embodiment, at least one of the arrester units of the device comprises more than one gas-filled surge arrester. For example, a plurality of gas-filled surge arresters may comprise greater than or equal to 4 or greater than or equal to 5 or greater than or equal to 10 or greater than or equal to 12 or greater than or equal to 20 gas-filled surge arresters. Accordingly, a surge arrester unit with a plurality of gas-filled surge arresters is configured as a multi-section arrester. The surge arresters of the plurality of surge arresters of an arrester unit are preferably connected in series.

Particularly preferably, the second arrester unit comprises a plurality of second surge arresters which are connected in series with one another. It is particularly advantageous if all surge arresters of the first and second arrester units, i.e. all first gas arresters and all second gas arresters, are connected in series with each other. Further, the second arrester unit may comprise at least one trigger circuit to enable synchronous ignition or at least substantially synchronous ignition of the second surge arresters. A trigger circuit may, for example, be formed by or comprise an RC element described further below.

According to a further embodiment, the first arrester unit comprises exactly one first surge arrester. In particular, this may mean that the first arrester unit comprises exactly one gas-filled surge arrester, which is the first surge arrester. Particularly preferably, the exactly one first surge arrester is connected in series with all second surge arresters.

According to a further embodiment, the first arrester unit comprises a larger response voltage than the second arrester unit. In particular, this can mean that the first surge arrester of the first arrester unit comprises a larger response voltage than the second surge arrester. If the first arrester unit comprises a plurality of first surge arresters, the features described above and in the following particularly preferably apply to each first surge arrester. Furthermore, the first arrester unit particularly preferably comprises a response voltage that is greater than a line voltage for operating the electrical appliance or the electrical network. This particularly preferably applies to the at least one first surge arrester of the first arrester unit.

If the second arrester unit comprises a plurality of second surge arresters, particularly preferably the first surge arrester of the first arrester unit comprises a larger response voltage than any second surge arrester of the second arrester unit. Preferably, the first arrester unit further comprises a smaller arc voltage than the second arrester unit. In particular, the second arrester unit may comprise a plurality of second surge arresters whose series connection has a larger arc voltage than the first arrester unit and, in particular, than the first gas-filled surge arrester. For example, the second arrester unit may comprise a response voltage that is less than a line voltage for operating the electrical appliance or electrical network.

According to a further embodiment, an RC element is coupled from at least one potential node between two adjacent second surge arresters to the reference potential node. Furthermore, alternatively or additionally an RC element may be coupled from a potential node between a first surge arrester and an adjacent second surge arrester to the reference potential node.

According to a further embodiment, an RC element is associated with each second surge arrester. If the second arrester unit comprises a number N of second surge arresters, in this case N RC element are also provided. An RC element is assigned to a surge arrester if the potential node from which the RC element is coupled to the reference potential node is arranged directly on the side of the relevant surge arrester facing the first potential node.

According to a further embodiment, a respective RC element with a resistor and capacitor connected in parallel is coupled from each potential node between two adjacent surge arresters, i.e. in particular all first and second surge arresters of the first and second arrester unit, to the reference potential node. If the first and second arrester units together comprise a number N of surge arresters, N−1 RC elements are provided.

An RC element, and preferably each RC element of the device, may comprise or consist of a resistor and a capacitor connected in parallel. Accordingly, the device and in particular the second arrester unit comprise at least one RC element and preferably a plurality of RC elements. For example, the device and in particular the second arrester unit may comprise, for example, 2, 3, 4, 5 or 10 RC elements. Each RC element may be directly coupled to the reference potential node, in particular without any further interposed electrical component. Each RC element is connected in parallel to at least one surge arrester, respectively.

Due to the resistor of an RC element connected in parallel to the capacitor, the capacitor is discharged by the resistor within a short time after a surge current. As a result, the response voltage of the associated surge arrester can remain constantly low. Furthermore, the response voltage with the capacitor-resistor combination may also be lower at the first response than, for example, without a resistor with only a capacitor.

According to a further embodiment, the device comprises groups of surge arresters. A group may comprise 2, 3 or more surge arresters. The device may comprise two, three or more groups. From a potential node between each group, an RC element may be coupled to the reference potential node with a resistor and capacitor connected in parallel. A group of surge arresters may be formed, for example, by a surge arrester designed as a multi-section arrester, which comprises a plurality of series-connected spark gaps in a structural unit.

According to a further embodiment, the time constant T of an RC element and in particular of each RC element is less than or equal to 1 ms. Thus, a fast discharge of the capacitor can be ensured and the impulse response voltage can be kept low.

According to a further embodiment, the capacitance C of the capacitor of an RC element and in particular of each RC element is between 1 nF and 40 nF, wherein the limits are respectively included. The higher the capacitance in this case, the higher the switch-through time and thus the response time of the associated surge arrester, and the response voltage decreases.

According to a further embodiment, the resistance R of an RC element and in particular of each RC element is between 1 k$\Omega$ and 100 k$\Omega$, wherein the limits are included in each case. The smaller the resistance value is in this case, the longer it takes to charge the capacitor during a current pulse and the switch-through time increases.

According to a further embodiment, the device for discharging overvoltages comprises a further first arrester unit with at least one first gas-filled surge arrester and at least one further second arrester unit with at least one second gas-filled surge arrester, wherein the further first arrester unit and the further second arrester unit are connected in series with one another between a second potential node and the reference potential node. The features described above for the first and second arrester units and for their surge arresters can preferably also apply to the further first arrester unit and the further second arrester unit and their surge arresters. Particularly preferably, the first arrester units, i.e. the first arrester unit and the further first arrester unit, are similar. Particularly preferably, the second arrester units, i.e. the second arrester unit and the further second arrester unit, are also similar. The fact that two arrester units are similar can in particular mean that they comprise the same components. The second potential node may correspond to a phase or an L conductor. For example, the first and second potential nodes in this case may correspond to two phases, such as L+ and L−.

According to a further embodiment, the surge arresters of the first and second arrester units are formed together as a integrally-formed multi-section arrester. In other words, the at least one first surge arrester and the at least one second surge arrester are formed as a coherent device in which the first and second surge arresters are integrated as a structural unit. Accordingly, the surge arresters of the further first and further second arrester units can also be formed together as an integrally-formed multi-section arrester. Accordingly, the surge arresters of the first and second arrester units and the surge arresters of the further first and further second arrester units can be formed together as a multi-piece multi-section arrester. Particularly preferably, the surge arresters of the first and second arrester units and the surge arresters of the further first and further second arrester units can be embodied together as a integrally-formed multi-section arrester. In particular, this can mean that all surge arresters of the device are integrated in a common device.

For example, the device described herein may be used in a telecommunications device, such as a telecommunications network. Further, the device may be used in an AC or DC network. In addition, the device may be used in any other electrical circuit in which voltages must be dissipated by means of surge arresters.

Particularly preferably, in the device for discharging overvoltages described herein, the first arrester unit is embodied in such a way that the first arrester unit can carry high lightning current surges, particularly preferably in particular (10/350 µs) current pulses, without changing its characteristics, in particular the response voltage, i.e. the response DC voltage and/or the impulse response voltage, and thus the protection level. In particular, the second arrester unit is especially preferably designed in such a way that its response voltage and thus its protection level are as low as possible. Particularly preferably, the response voltage and, in particular, the DC response voltage of the second arrester unit is lower than that of the mains voltage. In order to be able to operate the second arrester unit, which is embodied as a multi-section arrester, at a mains voltage, the first arrester unit is additionally provided, which comprises the at least one first surge arrester, which preferably comprises a robust internal design and whose response voltage and, in particular, whose DC response voltage is greater than the mains voltage. The first arrester unit and in particular the first surge arrester isolates the second arrester unit and thus the remaining sections of the device designed as a multi-section arrester from the mains voltage, so that ignition of the second surge arrester is prevented during normal operation. In this context, it is preferred that the response voltage of the whole arrester device is essentially determined by the first arrester unit, whose response voltage is greater than the mains voltage as described. Furthermore, it is particularly preferred that the second arrester unit is embodied such that its arc voltage is greater than that of the first arrester unit, so that a mains follow current can be reduced and, particularly preferably, extinguished by the second arrester unit. In the device described here, the combination of different gas arresters or arrester units with different properties thus makes it possible to combine the desired advantages of the individual gas arresters or arrester units in the arrester device embodied as a multi-section arrester.

BRIEF DESCRIPTION OF THE DRAWINGS

Further advantages, advantageous embodiments and further developments are revealed by the embodiments described below in connection with the figures, in which.

Figure 1:
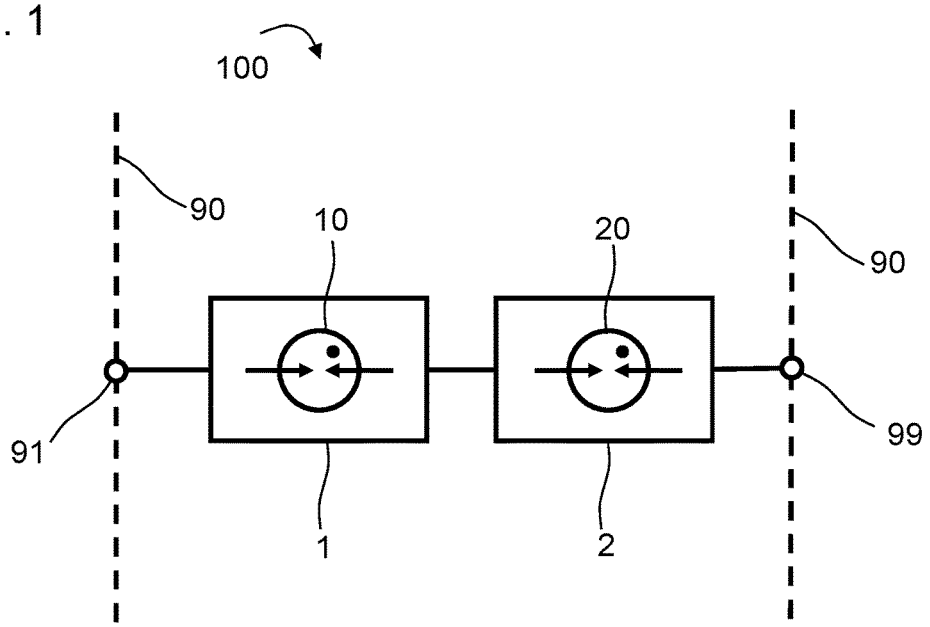
FIG. 1 shows a schematic illustration of a device for discharging overvoltages according to an exemplary embodiment.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

DETAILED DESCRIPTION OF ILLUSTRATIVE EMBODIMENTS

FIG. 1 shows an exemplary embodiment of a device 100 for discharging overvoltages. The device 100 is used in an electrical appliance and/or in an electrical network, the conductors 90 of which are indicated by the dashed lines. In addition to the two indicated conductors 90, more conductors may be present. For example, the conductors 90 may be part of an AC network or a DC network.

The device 100 comprises a first arrester unit 1 and a second arrester unit 2, which are connected in series between a first potential node 91 and a reference potential node 99. The reference potential node 99 corresponds, for example, to a protective conductor or PE conductor or a neutral conductor or N conductor, while the first potential node 91 preferably corresponds to a phase or L conductor, so that the first and second arrester units 1, 2 are connected in series between an L conductor and an N conductor or between an L conductor and a PE conductor. Alternatively, the first potential node 91 can also correspond to an N conductor, for example, and the reference potential node 99 can correspond to a PE conductor.

The first arrester unit 1 comprises at least one first gas-filled surge arrester 10, while the second arrester unit 2 comprises at least one second gas-filled surge arrester 20, which are connected in series with one another between the first potential node 91 and the reference potential node 99. The device 100 is thus embodied as a multi-section arrester. In FIG. 1 the interconnection of the surge arresters 10, 20 is merely indicated. A preferred circuit is shown, for example, in FIG. 2.

The first arrester unit 1 and the second arrester unit 2 are different from each other. In particular, the first arrester unit 1 and the second arrester unit 2 comprise different gas-filled surge arresters, so that the at least one first surge arrester 10 and the at least one second surge arrester 20 are different from each other.

The first arrester unit 1 and the second arrester unit 2 are embodied such that the first arrester unit 1 comprises a larger response voltage than the second arrester unit 2. This may apply to the DC response voltage or to the impulse response voltage, or preferably to both. In particular, the at least one first surge arrester 10 of the first arrester unit 1 may comprise a larger response voltage than the at least one second surge arrester 2 of the second arrester unit 2. In this context, the first arrester unit 1 particularly comprises a response voltage that is greater than a mains voltage between the conductors 90, i.e. between the first potential node 91 and the reference potential node 99, and thus greater than a mains voltage for operating the electrical appliance or the electrical network. This applies particularly preferably to the at least one first surge arrester 10 of the first arrester unit 1. In this way, it can be ensured that the first arrester unit 1 and in particular the at least one first surge arrester 10 do not ignite during normal operation, i.e. without, for example, an overvoltage caused by a lightning strike already at normal mains voltage.

The second arrester unit 2 comprises a response voltage that is smaller than the mains voltage between the conductors 90, and thus smaller than a mains voltage for operating the electrical appliance or the electrical network. However, since the first arrester unit 1 comprises a larger response voltage than the mains voltage, ignition of a surge arrester of the device 100 does not occur under normal conditions. In the event of an overvoltage, for example due to lightning, the at least one first surge arrester 10 of the first arrester unit 1 ignites, and thereafter, due to the lower response voltage, the at least one second surge arrester 20 of the second arrester unit 2 also ignites in any case, so that the lightning current surge resulting from the overvoltage can be effectively discharged to the reference potential node 99.

Furthermore, the first arrester unit 1 and the second arrester unit 2 are embodied such that the second arrester unit 2 comprises a larger arc voltage than the first arrester unit 1. The arc voltage of the first arrester unit 1, which is smaller than that of the second arrester unit 2, may be smaller than the mains voltage, which would result in the formation of a mains follow current between the first potential node 91 and the reference potential node 99 after the at least one surge arrester 10 of the first arrester unit 1 is ignited without the second arrester unit 2. Since the second arrester unit 2 is embodied such that its arc voltage is greater than that of the first arrester unit 1, the mains follow current can be reduced and, particularly preferably, extinguished by the second arrester unit 2. The combination of different arrester units with different characteristics thus makes it possible to combine the desired advantages of the individual arrester units in the arrester device 100.

In the following figures, preferred exemplary embodiments for the embodiment of the device 100 and in particular of the first and second arrester units 1, 2 and their surge arresters 10, 20 are shown.

Figure 2:
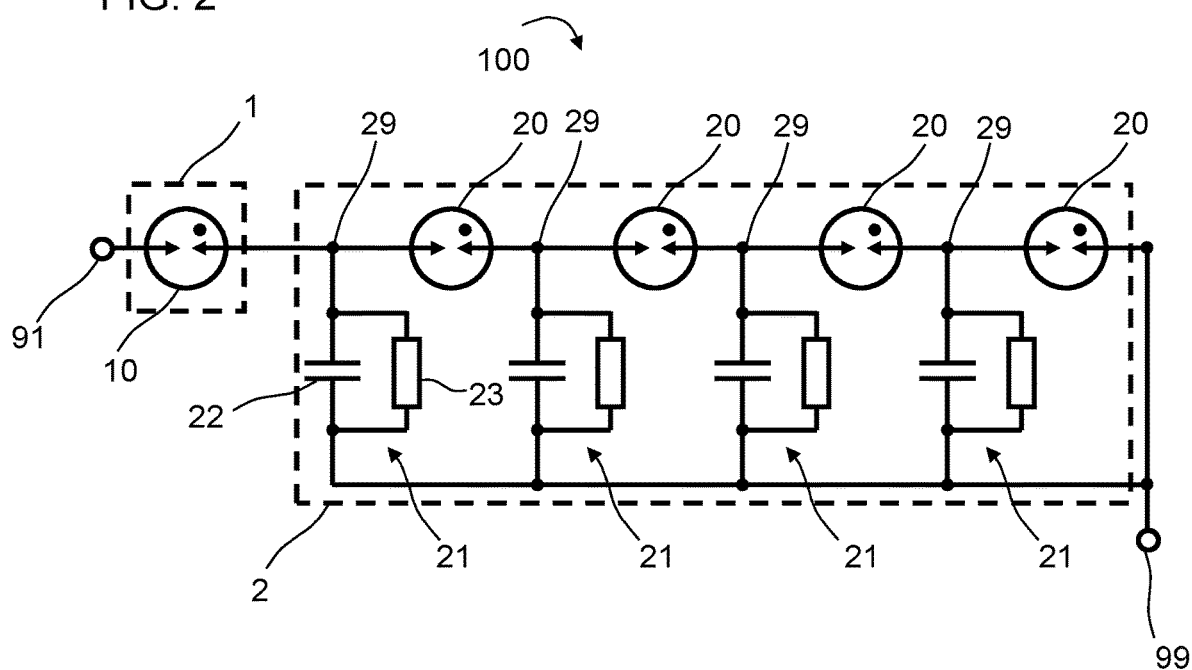
FIG. 2 shows a schematic illustration of a device for discharging overvoltages according to a further exemplary embodiment.

According to the exemplary embodiment of FIG. 2, the device 100 comprises a first arrester unit 1 and a second arrester unit 2, which are connected in series between the first potential node 91 and the reference potential node 99. In the exemplary embodiment shown, the first arrester unit 1 comprises exactly one gas-filled surge arrester 10 that comprises a response voltage that is greater than the line voltage between the first potential node 91 and the reference potential node 99.

The second arrester unit 2 comprises a plurality of second surge arresters 20 connected in series with each other and with the first surge arrester 10. The second surge arresters 20 comprise a response voltage that is lower than the response voltage of the first surge arrester 10 and, in particular, also lower than the line voltage. Purely by way of example, four second surge arresters 20 are shown. More or fewer second surge arresters 20 are also possible. For example, each of the second surge arresters 20 may itself in turn be a multi-section arrester, for example with three integrated gas arresters, as described in connection with FIG. 3. Furthermore, the second arrester unit 2 comprises a trigger circuit formed by RC elements 21.

In particular, a respective RC element 21 is coupled from a potential node 29 between two adjacent second surge arresters 20, to the reference potential node 99. In addition, an RC element 21 is coupled from a potential node 29 between the first surge arrester 10 and the adjacent second surge arrester 20 to the reference potential node 99, so that an RC element 21 is associated with each second surge arrester 20. If the second surge arresters 20 are formed as multi-section arresters, i.e. as a group of surge arresters in each case, an RC element 21 is assigned to each of these groups of surge arresters accordingly.

Each of the RC elements 21 comprises a capacitor 22 and a resistor 23 connected in parallel with each other. The trigger circuit is embodied in such a way that, in the event of a surge current at the corresponding RC element 21 caused by an overvoltage at the potential nodes 29, the respective capacitor 22 is first charged until the associated second surge arrester 20 ignites, and is then discharged again via the respective resistor 23, particularly preferably within a few milliseconds, so that the response voltage is thus kept low. Each RC element 21 is directly coupled to the reference potential node 99, in particular without any other intermediate electrical component. For example, the RC elements 21 may be formed such that the time constant $\tau = R \times C$ is in the millisecond range, wherein C is the capacitance of the capacitor 22 and R is the nominal value of the resistor 23. Particularly preferred is $\tau \leq 1$ ms, for example 0.9 ms or 0.5 ms.

For example, the capacitors 22 comprise a capacitance C in the region of greater than or equal to 1 nF and less than or equal to 40 nF. With higher capacitance C, the turn-on time, i.e. the response time, of the respective second surge arrester 20 increases, and the response voltage decreases. For example, the resistors 23 comprise a nominal value R in the region of greater than or equal to 1 k$\Omega$ and less than or equal to 100 k$\Omega$. The smaller the resistor value, the longer it takes to charge the respective associated capacitor 22 during a current pulse, and the turn-on time increases. Thus, by a suitable combination of capacitors 22 and resistors 23, it is possible to increase the number of second surge arresters 20 in the second arrester unit 2 compared to a multi-section arrester without a trigger circuit, without making the response voltage too high, while increasing the arc voltage and thus improving the quenching characteristics.

As described, the device 100 according to the exemplary embodiment of FIG. 2 is preferably formed with and particularly preferably from the following parts. The first arrester unit 1 with the first surge arrester 10 forms a gas arrester with an isolating function to isolate the second arrester unit 2 and thus the further gas arresters of the device 100 from the mains voltage between the first potential node 91 and the reference potential node 99. The first surge arrester 10 preferably comprises a robust design and a stable response voltage, in particular a stable DC response voltage, which is greater than the mains voltage. The second surge arresters 20 of the second arrester unit 2 form a multi-section arrester with a follow current quenching function. To this end, the second arrester unit 2 additionally comprises the trigger circuit formed by the RC elements 21, which enables synchronous firing or at least quasi-synchronous firing of the surge arresters, which is also advantageous for lowering the protection level. With other words, the second surge arresters 20 and the trigger circuit are specifically designed so that the second arrester unit 2 comprises a higher arc voltage compared to the first arrester unit 1 in order to quench a follow current. In this case, the response voltage and, in particular, the DC response voltage of the individual second arrester units 20 are smaller than the line voltage. With other words, the response voltage and in particular the response DC voltage of the second surge arresters 20 are reduced to achieve the best possible protection level. In particular, this reduces the protection level of the device 100 compared to a multi-section arrester formed, for example, only by a plurality of similar gas arresters in order to increase the are voltage.

Figure 3:
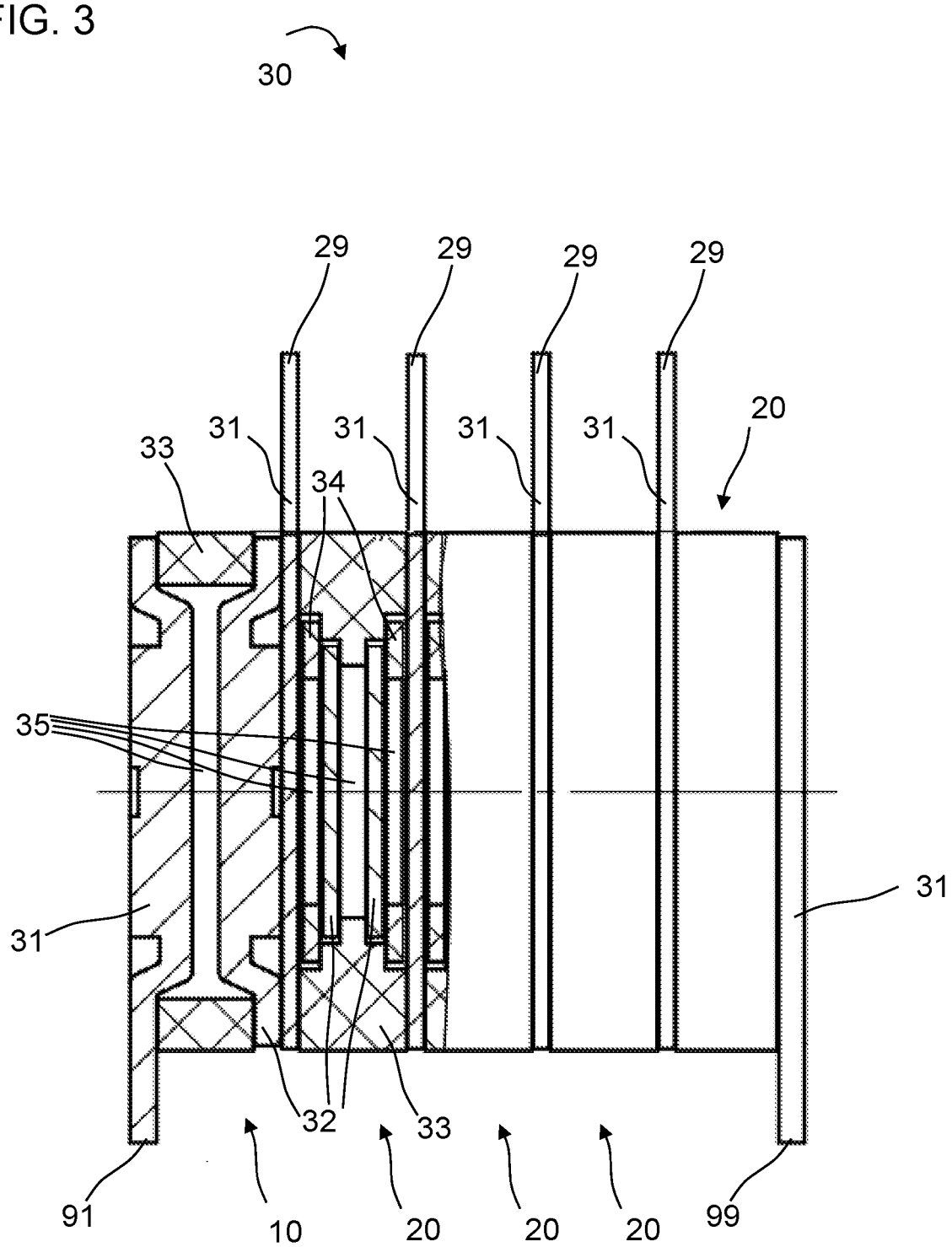
FIG. 3 shows a schematic illustration of a integrally formed multi-section arrester of a device for discharging overvoltages according to a further exemplary embodiment.

FIG. 3 shows a partial sectional view of an integrally-formed multi-section arrester 30 for a device 100 according to a further exemplary embodiment. In particular, the integrally-formed multi-section arrester 30 may be used in the device 100 according to the exemplary embodiment of FIG. 2.

In accordance with the device 100 of the previous exemplary embodiment, the multi-section arrester 30 comprises the one first surge arrester 10 of the first arrester unit and the four second surge arresters 20 of the second arrester unit, wherein each second surge arrester 20 is in turn a multi-section arrester with three integrated gas arresters. Accordingly, the second surge arresters 20 may also each be viewed as a group of surge arresters.

For external contacting the surge arresters 10, 20 at the potential nodes 29, 91 and 99, the multi-section arrester 30 comprises electrodes 31 which comprise outwardly guided connections representing the potential nodes 29, 91 and 99. Further, the multi-section arrester 30 comprises internal electrodes 32. The electrodes 31, 32 are arranged in a ceramic housing 33 formed by a continuous structure or by annular regions between the externally contactable electrodes 31.

As shown, the first surge arrester 10 comprises an externally contactable electrode 31 representing the first potential node 91 and an internal electrode 32, which are formed to be relatively massive with respect to the previously described dissipation properties. This allows the first surge arrester 10 to carry high lightning currents without changing its characteristics such as the DC response voltage or the protection level. A gas space 35 is formed between the electrodes 31, 32 of the first surge arrester 10 surrounded by the ceramic housing 33.

The second surge arresters 20 each comprise two externally contactable electrodes 31 representing the potential nodes 29, between each of which two internal electrodes 32 are arranged, wherein the electrodes 31, 32 of the second surge arresters 20 are arranged spaced apart from each other by the ceramic housing 33 and spacers 34 in the form of ceramic spacer rings to form gas spaces 35. The externally contactable electrode 31 arranged farthest from the first surge arrester 10 represents the reference potential node 99.

The arrester characteristics of the first and second surge arresters 10, 20 described above can be adjusted by the choice of material, geometry and spacing of the electrodes 31, 32 as well as by the gas contained in the respective gas chambers 35 and its respective pressure. In particular, for example, pure noble gases or mixtures of noble gases can be used in the surge arresters 10, 20, for example one or more selected from Ar, Ne, Kr, He, $N_2$. Particularly advantageous mixtures with mixing ratios indicated in parentheses include $Ne/Ar/H_2$ (41/41/18), $Ne/Ar/H_2$ (57/3/40), $Ar/H_2$ (80/20), $Ar/H_2$ (60/40), Ne/Ar (90/10). Advantageous pressure ranges can range from greater than or equal to 0.1 bar to less than or equal to 2.5 bar.

Figure 4:
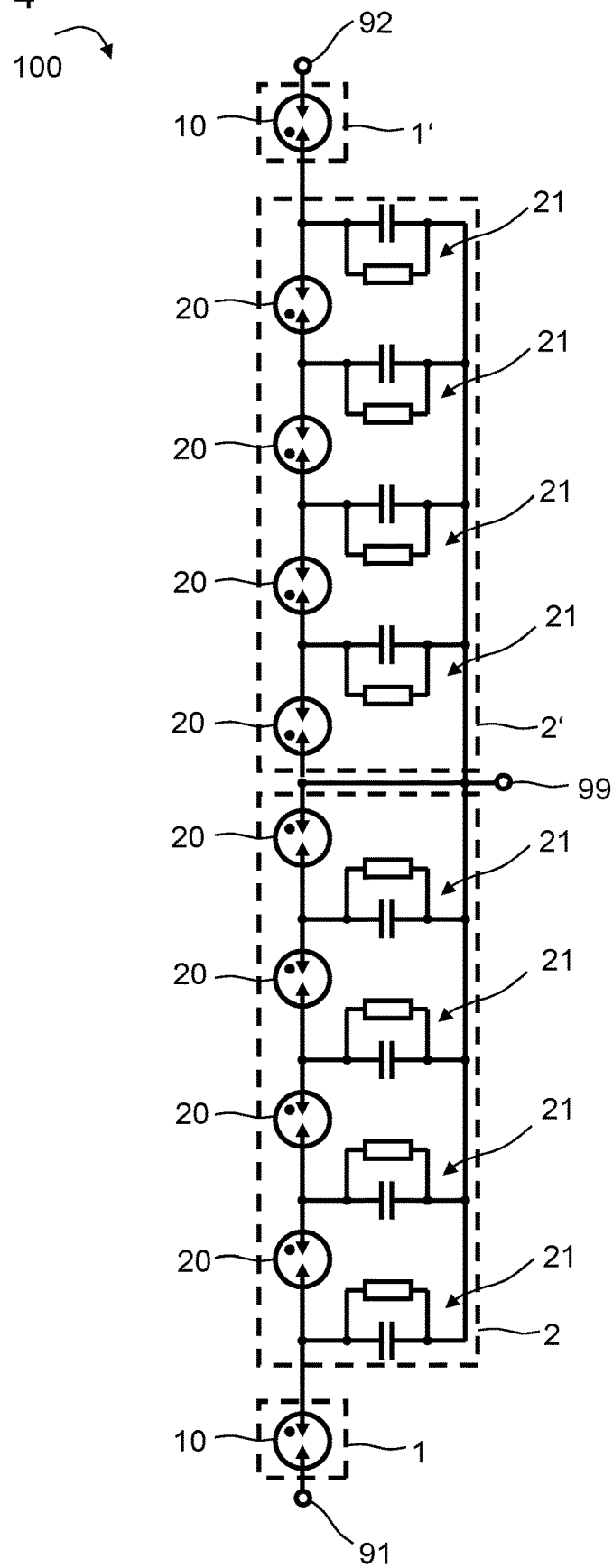
FIG. 4 shows a schematic illustration of a device for discharging overvoltages according to a further exemplary embodiment.

FIG. 4 shows the device 100 according to a further exemplary embodiment. The device 100 comprises a first arrester unit 1 and a second arrester unit 2, which are connected in series between a first potential node 91 and a reference potential node 99. In particular, the first and second arrester units 1, 2 are formed as in the exemplary embodiment of FIG. 2.

Furthermore, the device 100 comprises a further first arrester unit 1' with at least one first gas-filled surge arrester 10 and at least one further second arrester unit 2' with at least one second gas-filled surge arrester 20, wherein the further first arrester unit 1' and the further second arrester unit 2' are connected in series with one another between a second potential node 92 and the reference potential node 99. The second potential node 92 may correspond to a phase or L conductor. For example, the first and second potential nodes 91, 92 may correspond to two phases, such as L+ and L−, while the reference potential node 99 corresponds to a protective conductor.

The features described in connection with FIG. 2 for the first and second arrester units 1, 2 and for the first and second surge arresters 10, 20 also apply to the further first arrester unit 1' and the further second arrester unit 2'. Particularly preferably, the first arrester unit 1 and the further first arrester unit 1' as well as the second arrester unit 2 and the further second arrester unit 2' are each similar, so that the device 100 shown in FIG. 4 is symmetrical with respect to the reference potential node 99.

Figure 5:
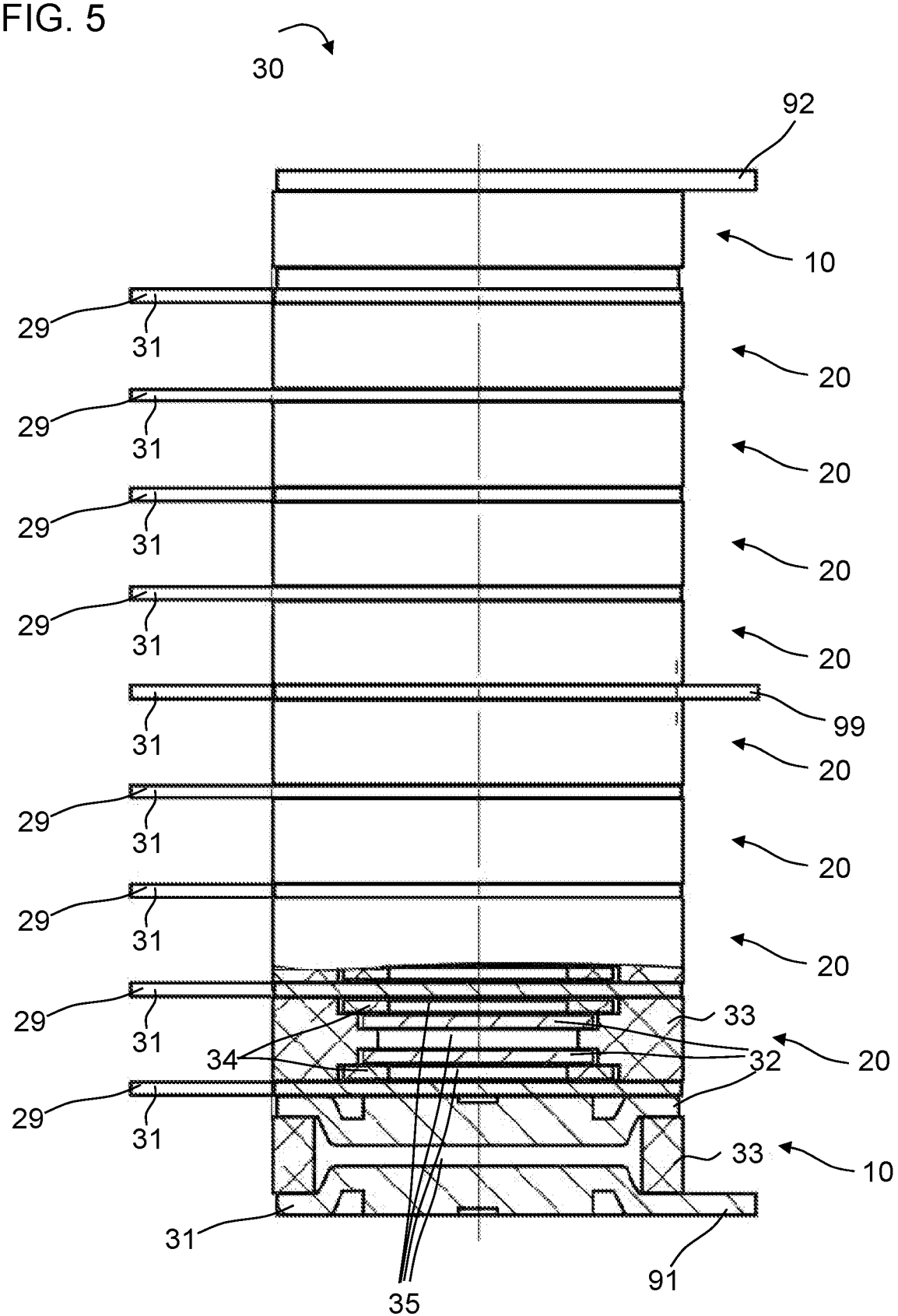
FIG. 5 shows a schematic illustration of a integrally formed multi-section arrester of a device for discharging overvoltages according to a further exemplary embodiment.

In FIG. 5, a multi-section arrester 30 for the device 100 according to the exemplary embodiment of FIG. 4 is shown, which is constructed analogously to the multi-section arrester 30 of the exemplary embodiment of FIG. 3. In particular, the surge arresters 10, 20 of the first and second arrester units and the surge arresters 10, 20 of the further first and further second arrester units are formed together as an integrally-formed multi-section arrester 30, so that in particular all surge arresters 10, 20 of the device 100 of the exemplary embodiment of FIG. 4 are integrated in a common device. Alternatively, the surge arresters 10, 20 of the first and second arrester units as well as the surge arresters 10, 20 of the further first and second arrester units can each be formed as multi-section arresters 30 according to the exemplary embodiment of FIG. 3, which are interconnected with each other, and thus as a multi-part multi-section arrester. As in FIG. 3, the potential nodes 29, 91, 92, 99 represented by the externally contactable electrodes 31 are also indicated in FIG. 5. The individual parts and components of the multi-section arrester 30 of FIG. 5 correspond to those of the multi-section arrester 30 of FIG. 3.

The features and embodiments described in connection with the figures may be combined in accordance with further exemplary embodiments, although not all combinations are explicitly described. Furthermore, the exemplary embodiments described in connection with the figures may alternatively or additionally comprise further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A device comprising:
   a first arrester unit with at least one first gas-filled surge arrester; and
   a second arrester unit with at least one second gas-filled surge arrester,
   wherein the first and second arrester units are connected in series with one another between a first potential node and a reference potential node,
   wherein the first arrester unit and the second arrester unit are different from each other,
   wherein the first arrester unit comprises a larger response voltage than the second arrester unit,
   wherein the first arrester unit comprises a smaller arc voltage than the second arrester unit, and
   wherein the device is configured to discharge an overvoltage.

2. The device of claim 1, wherein the first arrester unit comprises exactly one first surge arrester.

3. The device according to claim 1, wherein the second arrester unit comprises a plurality of second surge arresters connected in series with each other.

4. The device according to claim 1, wherein all surge arresters of the first and second arrester units are connected in series with each other.

5. The device according to claim 1, further comprising a respective RC element with a capacitor and a resistor connected in parallel, wherein the RC element is coupled to the reference potential node from a potential node between two adjacent second surge arresters.

6. The device according to claim 5, wherein the RC element is associated with each second surge arrester.

7. The device according to claim 5, wherein each RC element is directly coupled to the reference potential node.

8. The device according to claim 1, further comprising an RC element with a capacitor and a resistor connected in parallel, wherein the RC element is coupled to the reference potential node from a potential node between a first surge arrester and an adjacent second surge arrester.

9. The device according to claim 1, wherein the surge arresters of the first and second arrester units are arranged together as an integrally-formed multi-section arrester.

10. The device according to claim 1, further comprising:
    a further first arrester unit with at least one first gas-filled surge arrester and at least one further second arrester unit with at least one second gas-filled surge arrester,
    wherein the further first arrester unit and the further second arrester unit are connected in series with one another between a second potential node and the reference potential node, and
    wherein the first arrester units are similar and the second arrester units are similar.

11. The device according to claim 10, wherein the surge arresters of the first and second arrester units and the surge arresters of the further first and further second arrester units are arranged together as an integrally-formed multi-section arrester.

12. The device according to claim 10, wherein the surge arresters of the first and second arrester units and the surge arresters of the further first and further second arrester units are arranged as a multi-part multi-section arrester.

13. An electrical appliance or an electrical network comprising:
    the device according to claim 1.

14. The electrical appliance or the electrical network according to claim 13, wherein the first arrester unit comprises a response voltage greater than a mains voltage for operating the electrical appliance or the electrical network.

* * * * *